(12) United States Patent
An et al.

(10) Patent No.: US 8,558,813 B2
(45) Date of Patent: Oct. 15, 2013

(54) HAPTIC FEEDBACK ACTUATOR, HAPTIC FEEDBACK DEVICE AND ELECTRONIC DEVICE

(75) Inventors: Seung Do An, Gyunggi-do (KR); Jong Hyeong Song, Gyunggi-do (KR); Jong Woo Han, Gyunggi-do (KR); Hae Seung Hyun, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 138 days.

(21) Appl. No.: 13/067,488

(22) Filed: Jun. 3, 2011

(65) Prior Publication Data

US 2011/0310055 A1 Dec. 22, 2011

(30) Foreign Application Priority Data

Jun. 21, 2010 (KR) .................. 10-2010-0058630

(51) Int. Cl.
*G06F 3/045* (2006.01)

(52) U.S. Cl.
USPC ........................... 345/174; 345/156; 345/173

(58) Field of Classification Search
USPC ................................................ 345/156–173
See application file for complete search history.

(56) References Cited

U.S. PATENT DOCUMENTS

| 7,446,456 | B2 | 11/2008 | Maruyama et al. | |
|---|---|---|---|---|
| 2002/0149561 | A1* | 10/2002 | Fukumoto et al. | 345/156 |
| 2005/0184621 | A1 | 8/2005 | Kitahara et al. | |
| 2006/0049834 | A1* | 3/2006 | Umeda | 324/658 |
| 2007/0096594 | A1* | 5/2007 | Maruyama et al. | 310/317 |
| 2009/0072662 | A1* | 3/2009 | Sadler et al. | 310/319 |
| 2009/0085879 | A1* | 4/2009 | Dai et al. | 345/173 |
| 2009/0322496 | A1* | 12/2009 | da Costa | 340/407.2 |

FOREIGN PATENT DOCUMENTS

| JP | 2005-237102 | 9/2005 |
|---|---|---|
| JP | 2006-020138 | 1/2006 |

* cited by examiner

*Primary Examiner* — Viet Pham

(57) ABSTRACT

There is provided a haptic feedback actuator according to an exemplary embodiment of the present invention, including: a vibrating plate provided on one surface of a haptic device to transfer vibrations; and an actuator provided on the haptic device and including a composite layer in which a sensing electrode providing a sensing voltage Va based on a touch pressure of the haptic device and a driving electrode providing a driving voltage Vd corresponding to the sensing voltage Va are formed and a piezoelectric material generating vibrations according to the driving voltage Vd by being combined with one surface of the composite layer.

16 Claims, 5 Drawing Sheets

HAPTIC FEEDBACK ACTUATOR, HAPTIC FEEDBACK DEVICE AND ELECTRONIC DEVICE

CROSS-REFERENCE TO RELATED APPLICATIONS

This application claims the priority of Korean Patent Application No. 10-2010-0058630 filed on Jun. 21, 2010, in the Korean Intellectual Property Office, the disclosure of which is incorporated herein by reference.

BACKGROUND OF THE INVENTION

1. Field of the Invention

The present invention relates to a haptic feedback actuator, a haptic feedback device, and an electronic device, and more particularly, to a haptic feedback actuator holding sensing ability while minimizing loss of driving force in an actuator, a haptic feedback device, and an electronic device.

2. Description of the Related Art

Recently, a touch type device for performing user input by touching the screen of an electronic product according to the desire to provide simple and efficient use of an electronic device has been prevalently used.

Currently, a haptic feedback device includes the concept of reflecting an intuitive user experience with a user interface and diversifying feedback for a touch, in addition to the concept of performing an input by touch.

In this case, the haptic feedback device has various advantages of facilitating compatibility with IT devices, in addition to saving space, improving operability and simplicity, easily changing specifications, and increasing user recognition.

Owing to these advantages, the haptic feedback device has been widely used in various fields such as computing, traffic management, service industries, medical treatment, mobile applications, or the like.

Generally, the haptic feedback device applies vibrations when a user presses the touch panel with his/her fingers to transfer haptic feeling to the user.

However, in order to transfer a more exclusive feeling to the user, that is, in order to increase a feedback effect to the user, a method of mounting an additional pressure sensor or mounting an actuator further including a sensing layer on an opposite surface of a driver to be adjacent to a display panel has been used in the related art.

However, the related art method of mounting the pressure sensor has the problems of increasing the volume, complicating the assembly, and increasing raw material prices of the finished product, due to the added sensor.

In addition, the method of mounting the sensing layer on the opposite surface of the driver has a problem in that the driving force is lost, corresponding to the sensing layer, by allowing all of one or more specific layers to be used to sense the touch.

Therefore, research into transferring exclusive haptic feeling without affecting the volume of, and losing driving force in, the haptic feedback device is urgently needed.

SUMMARY OF THE INVENTION

An aspect of the present invention provides a haptic feedback actuator capable of minimizing reduction in driving force by allowing a part of a layer on which a driving electrode of an actuator is formed to be used to sense a touch, a haptic feedback device, and electronic devices.

According to an aspect of the present invention, there is provided a haptic feedback actuator, including: a vibrating plate provided on one surface of a haptic device to transfer vibrations; and an actuator provided on the haptic device and including a composite layer in which a sensing electrode providing a sensing voltage Va based on a touch pressure of the haptic device and a driving electrode providing a driving voltage Vd corresponding to the sensing voltage Va are formed and a piezoelectric material generating vibrations according to the driving voltage Vd by being combined with one surface of the composite layer.

The actuator may include a ground electrode layer that is a reference of voltage of the driving electrode and the sensing electrode, and the piezoelectric material may be disposed between the composite layer and the ground electrode layer.

The actuator may include a plurality of driving electrode layers including the driving electrode, and the ground electrode layer may be provided between the plurality of driving electrode layers to apply the driving voltage Vd for generating vibrations.

The actuator may include the piezoelectric material disposed between the driving electrode layer and the ground electrode layer.

The composite layer may correspond to the uppermost layer of the actuator.

According to another aspect of the present invention, there is provided a haptic feedback device, including: a display panel provided to a haptic device requiring vibrations; an actuator including a composite layer in which a sensing electrode providing a sensing voltage Va based on a touch pressure of the display panel and a driving electrode providing a driving voltage Vd corresponding to the sensing voltage Va are formed and a piezoelectric material generating vibrations according to the driving voltage Vd by being combined with one surface of the composite layer; and a vibrating plate disposed between the display panel and the actuator to amplify vibrations generated in the actuator and transfer it to the display panel.

The actuator may include a ground electrode layer that is a reference of voltage of the driving electrode and the sensing electrode, and the piezoelectric material may be disposed between the composite layer and the ground electrode layer.

The actuator may include a plurality of driving electrode layers including the driving electrode and the ground electrode layer may be provided between the plurality of driving electrode layers to apply the driving voltage Vd for generating vibrations.

The actuator may include a piezoelectric material disposed between the driving electrode layer and the ground electrode layer.

The composite layer may correspond to the uppermost layer of the actuator.

According to another aspect of the present invention, there is provided an electronic device, including: a case formed in an inner space; a display panel disposed to be received in the case; an actuator including a composite layer in which a sensing electrode providing a sensing voltage Va based on a touch pressure of the display panel and a driving electrode providing a driving voltage Vd corresponding to the sensing voltage Va are formed and a piezoelectric material generating vibrations according to the driving voltage Vd by being combined with one surface of the composite layer; and a vibrating plate disposed between the display panel and the actuator to amplify vibrations generated in the actuator and transfer it to the display panel.

The actuator may include a plurality of driving electrode layers including the driving electrode, and the ground electrode layer is provided between the plurality of driving electrode layers to apply the driving voltage Vd for generating vibrations.

The composite layer may correspond to the uppermost layer of the actuator.

BRIEF DESCRIPTION OF THE DRAWINGS

The above and other aspects, features and advantages of the present invention will be more clearly understood from the following detailed description taken in conjunction with the accompanying drawings, in which.

DETAILED DESCRIPTION OF THE PREFERRED EMBODIMENT

Figure 1:
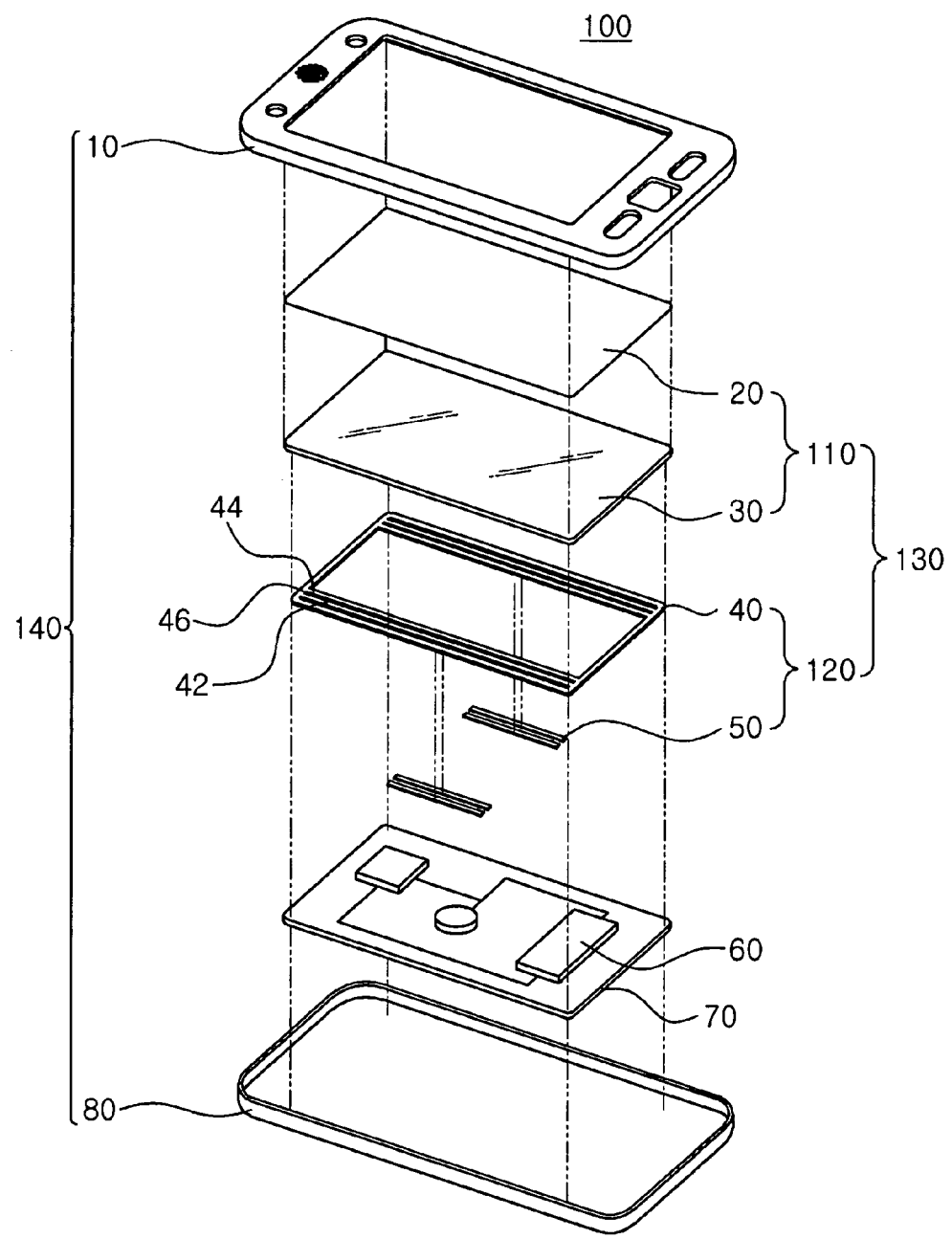
FIG. 1 is an exploded perspective view of a mobile communications terminal according to an exemplary embodiment of the present invention.

Exemplary embodiments of the present invention will now be described in detail with reference to the accompanying drawings. However, it should be noted that the spirit of the present invention is not limited to the exemplary embodiments set forth herein and those skilled in the art and understanding the present invention could easily accomplish retrogressive inventions or other exemplary embodiments included in the spirit of the present invention by the addition, modification, and removal of components within the same spirit; however, those are to be construed as being included in the spirit of the present invention.

In addition, components having like functions are denoted by like reference numerals throughout the drawings of each exemplary embodiment.

Figure 2:
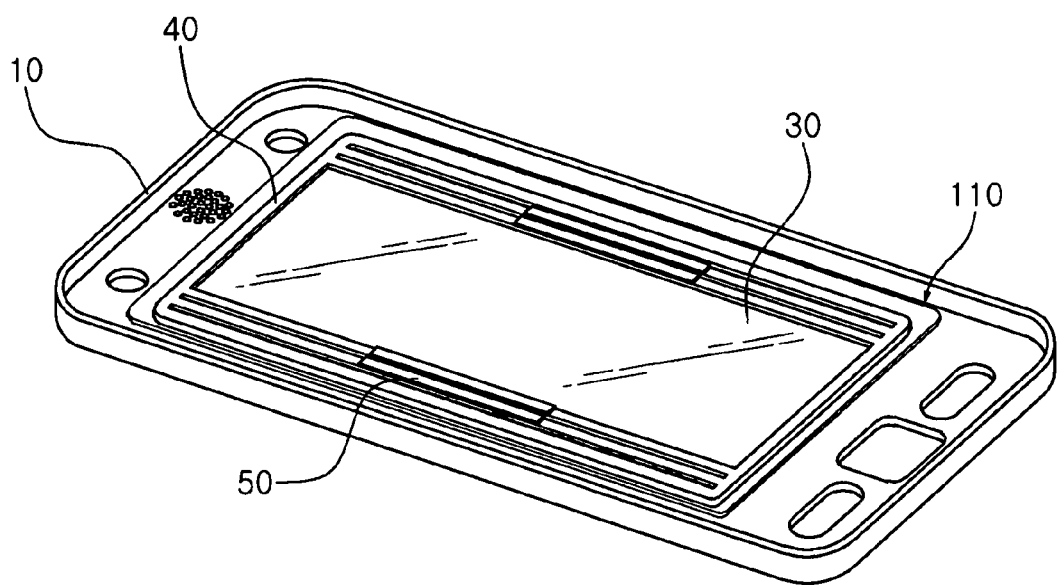
FIG. 2 is a perspective view schematically showing a way in which a haptic feedback device mounted in a case of the mobile communications terminal according to the exemplary embodiment of the present invention.
Figure 3:
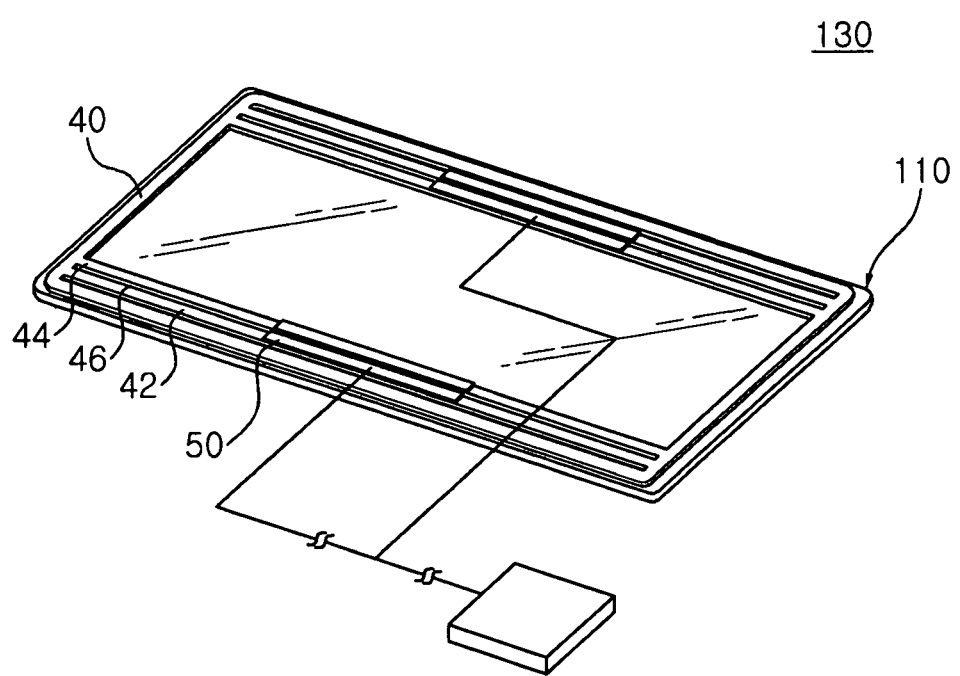
FIG. 3 is a perspective view schematically showing the haptic feedback device according to the exemplary embodiment of the present invention.

FIG. 1 is an exploded perspective view of an electronic device, a mobile communications terminal according to an exemplary embodiment of the present invention, FIG. 2 is a perspective view schematically showing a way in which a haptic feedback device is mounted in a case of the mobile communications terminal according to the exemplary embodiment of the present invention, and FIG. 3 is a perspective view schematically showing the haptic feedback device according to the exemplary embodiment of the present invention.

An electronic device, a mobile communications terminal 100 according to an exemplary embodiment of the present invention, is described by way of example; however, the exemplary embodiment of the present invention is not limited thereto. Therefore, the exemplary embodiment of the present invention may be applied to all of the haptic devices changing vibrations according to the touch of the user, such as various OA devices, items of medical equipment, mobile communications devices, traffic pass card issuing devices, or the like.

The electronic device, the mobile communication device 100, will now be described in detail.

Referring to FIGS. 1 to 3, the electronic device, the mobile communications terminal 100 according to the exemplary embodiment of the present invention, may include a case 140 and a haptic feedback device 130.

The case 140 may be constituted by a front case 10 and a rear case 80, wherein an inner space may be formed by a combination of the front case 10 and the rear case 80.

The haptic feedback device 130 may be mounted in the inner space. The haptic feedback device includes a haptic feedback actuator 120, wherein the haptic feedback actuator 120 may be operated by a controller 60 mounted on a circuit board 70.

In this configuration, the haptic feedback device 130 may include the haptic device 110 and the haptic feedback actuator 120.

The haptic device 110, which is a device receiving vibrations, is a device installed in the electronic device, the mobile communications terminal 100 reacting to a touch pressure from the outside.

The haptic device 110 may be used for a display panel 30 of the mobile communications terminal 100 as well as input devices, for example, OA devices, vending machines, ticket issuing machines, or the like, all of which should generate vibrations according to touch pressure.

The electronic device, the mobile communications terminal 100 according to the exemplary embodiment, may include the display panel 30 displaying images as the haptic device 110 and a touch panel 20 to which pressure is directly applied from the outside. That is, when touch pressure is applied to the touch panel 20, the haptic device 110 reacts haptically to the touch pressure.

In this case, the touch panel 20 may be formed by stacking an outer film layer, an indium-tin-oxide film layer, and a base film layer and the display panel 30 is disposed on the bottom of the touch panel 20 to emit light incident on the front of the mobile communications terminal 100.

In this case, the display panel 30 may selectively use one of a liquid crystal display (LCD), a plasma display panel (PDP), and an electroluminescence (EL) device, but is not necessarily limited thereto. Therefore, it is to be noted that the display panel 30 can be changed by those skilled in the art and understanding the ideas behind the present invention.

The haptic feedback actuator 120 may include a vibrating plate 40 and an actuator 50. In addition, the haptic feedback device 130 may include the haptic device 110 to which touch pressure is applied and the haptic feedback actuator 120 vibrating the haptic device 110.

The vibrating plate 40 may transfer the vibrations generated in the actuator 50 to the display panel 30 and vibrate the display panel 30 through the direct attachment of the actuator 50 to the display panel 30. However, the vibrating plate 40 may be optionally used in order to mitigate the impact of the vibrations or to amplify the vibrations, if necessary.

In other words, the vibrating plate 40 configuring the haptic feedback actuator 120 may be optional.

In this configuration, the vibrating plate 40 can be obtained by the injection of the material for mitigating the impact of vibrations, but is not limited thereto. The thickness of the vibrating plate may be changed in consideration of the interaction with the actuator 50.

The vibrating plate 40 may be disposed to be formed as a thin strip according to an edge portion of a rectangular shape of the display panel 30.

Herein, when defining direction, a long side of the display panel 30 in the rectangular shape is defined as the length direction and a short side thereof is defined as the width direction.

In detail, the vibrating plate 40 may have a plurality of branch lines 42 and 44 at an edge portion of the length direction of the haptic device 110, the display panel 30, wherein a slit 46 may be formed between the plurality of branch lines 42 and 44.

In this configuration, the branch lines 42 and 44 may have approximately the same width, and the actuator 50 in a bar shape having approximately the same width as the branch lines 42 and 44 may be disposed to be bonded to the branch lines 42 and 44. In this configuration, the actuator 50 may be disposed in parallel with the branch lines 42 and 44.

However, the bonding position of the actuator 50 to the vibrating plate 40 is not limited to a central portion of the branch lines 42 and 44 but is formed to be biased to a part thereof or a plurality of bonding positions may be formed on the branch lines 42 and 44, respectively.

A detailed description of the structure and operational principle of the actuator 50 will be described below with reference to FIGS. 4 and 5.

Figure 4:
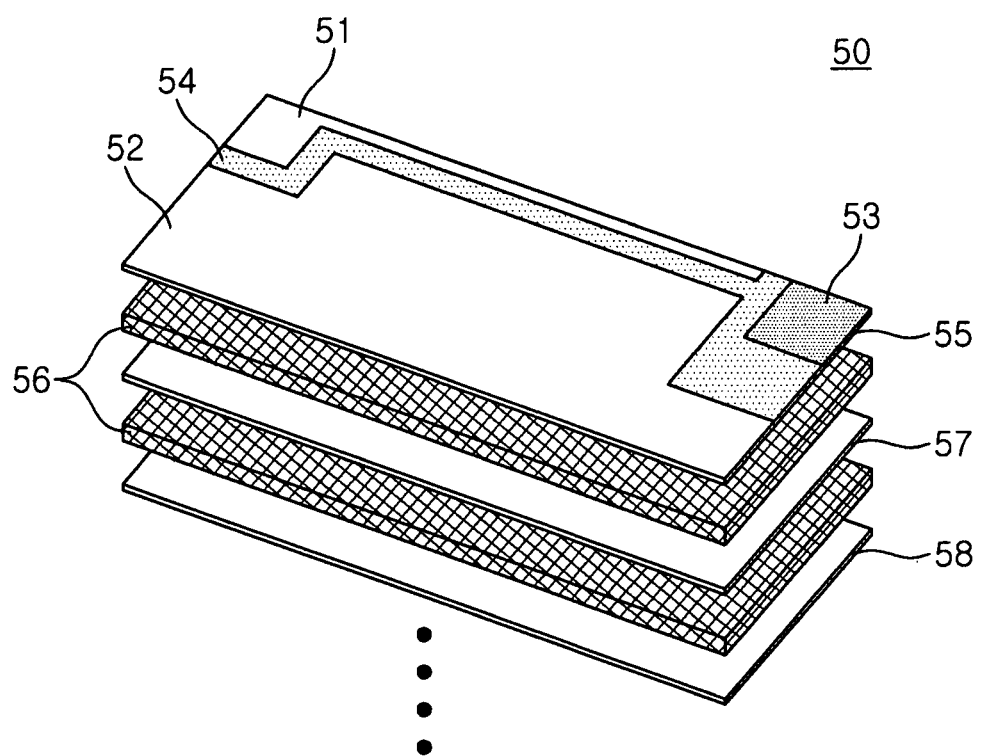
FIG. 4 is an exploded perspective view schematically showing an actuator mounted in the haptic feedback device according to the exemplary embodiment of the present invention.
Figure 5:
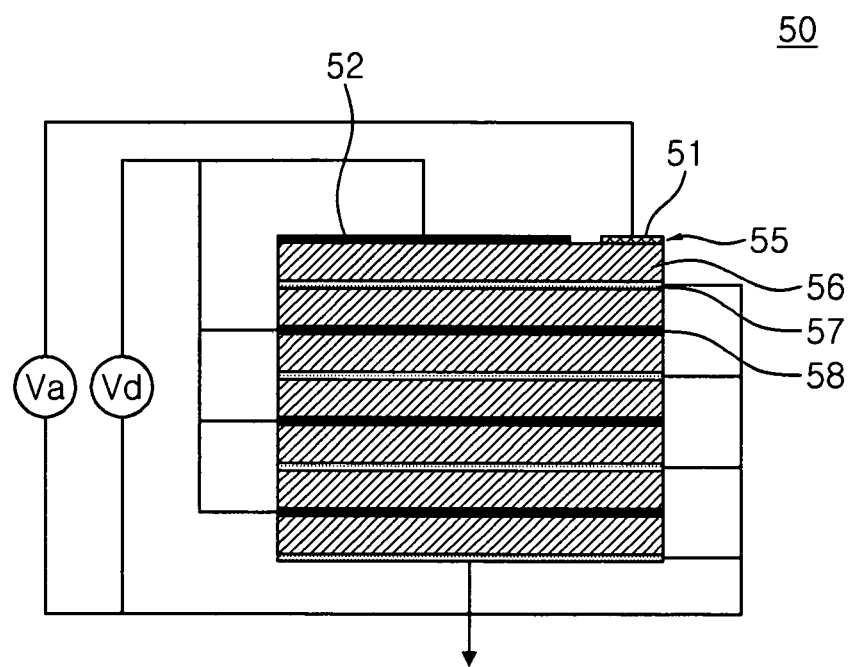
FIG. 5 is a cross-sectional view schematically showing a sensing electrode and a driving electrode of the actuator according to the exemplary embodiment of the present invention.

FIG. 4 is an exploded perspective view schematically showing an actuator mounted in the haptic feedback device according to the exemplary embodiment of the present invention and FIG. 5 is a cross-sectional view schematically showing a sensing electrode and a driving electrode of the actuator according to the exemplary embodiment of the present invention.

Referring to FIGS. 4 and 5, the actuator 50 according to the exemplary embodiment of the present invention is provided in the haptic device 110 and may include a composite layer 55, a piezoelectric material 56, a driving electrode layer 58, and a ground electrode layer 57.

The actuator 50 may be a piezo actuator and generate vibrations by being vibrated according to the change in touch pressure of the display panel 30 and the touch panel 20 of the haptic device 110.

The composite layer 55 of the actuator 50 may be provided with the sensing electrode providing a sensing voltage Va based on touch pressure from the haptic device 110 and a driving electrode 52 providing a driving voltage Vd according to the sensing electrode 51.

In addition, the composite layer 55 may simultaneously be provided with a ground electrode 53 that is the reference of voltage of the driving electrode 52 and the sensing electrode 51, but is not limited thereto.

Further, the composite layer 55 may be disposed with an insulator 54 insulating the driving electrode 52 from the sensing electrode 51 and the driving electrode 52 and the sensing electrode 51 may be separated from each other within the composite layer 55 due to the insulator 54.

The lower portion of the composite layer 55 may be disposed with the piezoelectric material 56, wherein the vibrations may be transferred to the haptic device 110 by the expansion and contraction in the length direction of the piezoelectric material 56.

The lower portion of the piezoelectric material 56 may be provided with a ground electrode layer 57 and the voltage of the driving electrode 52 and the sensing electrode 51 may be applied based on the ground electrode layer 57 due to the ground electrode layer 57.

A plurality of further piezoelectric materials 56, ground electrode layers 57, and driving electrode layers 58 may be stacked on the lower portions of the composite layer 55, the piezoelectric material 56, and the ground electrode layer 57.

The plurality of driving electrode layers 58 are formed, such that the expansion and contraction in the length direction of the piezoelectric material 56 may be strong. Therefore, the magnitude of vibrations transferred to the haptic device 110 may be increased.

In this case, the up and down vibrations of the haptic device 110 may be generated by the expansion and contraction in the length direction of the piezoelectric material 56. The reason is that the vibrating plate 40 is made of a material not generating the change in the length direction. Therefore, the haptic device 110 is not vibrated in the expanding and contracting direction of the piezoelectric material but vibrated in the up and down direction.

In addition, the composite layer 55 may be disposed on the uppermost layer of the plurality of layers configuring the actuator 50.

The operating principle of the actuator 50 will be described herein. When touch pressure is applied to the haptic device 110, the sensing electrode of the actuator 50 senses the touch pressure, thereby applying the sensing voltage Va to the controller 60 formed on the circuit board 70 as shown in FIG. 3.

The controller 60 receiving the sensing voltage Va applies the driving voltage Vd corresponding to the sensing voltage Va to the driving electrode 52 of the actuator 50, such that the plurality of piezoelectric materials 56 are expanded and contracted in the length direction.

In this case, the sensing electrode 51 has no effect on the operation of the actuator 50 when the actuator 50 is operated, that is, when the piezoelectric material 56 is expanded and contracted in the length direction.

Therefore, since the portion in which the sensing electrode 51 is formed naturally leads to the loss of driving ability, as the area in which the sensing electrode 51 is formed is reduced, thereby making it possible to minimize the loss of driving force. This is theoretically as follows:

Sensing the voltage Va according to touch pressure applied to the haptic device 110=Material constant G of sensing electrode*Stress for touch pressure applied to haptic device 110*Thickness of piezoelectric material 56.

Therefore, since the sensing voltage Va has no connection with the area in which the sensing electrode 51 is formed, the sensing ability of the actuator 50 is not reduced only when the pattern can be formed, even though the pattern is formed to reduce the size of the sensing region.

Therefore, in the actuator 50 according to the exemplary embodiment of the present invention, since the driving electrode 52 and the sensing electrode 51 are formed in the composite layer 55 that is the same layer and the area occupied by the sensing electrode 51 is relatively small in the composite layer 55, the driving force of the actuator 50 is not approximately lost.

Further, the driving electrode 52 and the sensing electrode 51 are simultaneously formed in one actuator 50 to reduce the installation space as compared to the case in which they are installed individually, thereby making it possible to promote the compactness of the electronic device.

As described above, the sensing electrode 51 sensing touch pressure applied to the haptic device 110 in the actuator 50 and the driving electrode 52 driving the actuator 50 are simultaneously formed on the composite layer 55 that is the same layer, thereby making it possible to minimize the loss of the driving force due to the touch sensing without separately needing the electrode layer to sense the touch Further, since the driving electrode 52 and the sensing electrode 51 are simultaneously formed on the same layer, the installation space of the actuator 50 is reduced in the electronic device, thereby making it possible to make the electronic device small and compact.

As set forth above, according to the haptic feedback actuator, the haptic feedback device, and the electronic devices, the present invention can minimize the loss of the driving force by minimizing the sensing region of the actuator.

In addition, the present invention can minimize the volume by forming the driving electrode and the sensing electrode on the same layer of the actuator.

While the present invention has been shown and described in connection with the exemplary embodiments, it will be apparent to those in the art that modifications and variations can be made without departing from the spirit and scope of the invention as defined by the appended claims.

What is claimed is:

1. A haptic feedback actuator, comprising:
a vibrating plate provided on one surface of a haptic device to transfer vibrations; and
an actuator provided on the haptic device and including a composite layer in which a sensing electrode providing a sensing voltage Va based on a touch pressure of the haptic device and a driving electrode providing a driving voltage Vd corresponding to the sensing voltage Va are formed and a piezoelectric material generating vibrations according to the driving voltage Vd by being combined with one surface of the composite layer,
the sensing electrode and the driving electrode formed on the same layer, and
in the composite layer, an area occupied by the sensing electrode being smaller than an area occupied by the driving electrode.

2. The haptic feedback actuator of claim 1, wherein the actuator includes a ground electrode layer that is a reference of voltage of the driving electrode and the sensing electrode, and
the piezoelectric material is disposed between the composite layer and the ground electrode layer.

3. The haptic feedback actuator of claim 1, wherein the actuator includes a plurality of driving electrode layers including the driving electrode, and
the ground electrode layer is provided between the plurality of driving electrode layers to apply the driving voltage Vd for generating vibrations.

4. The haptic feedback actuator of claim 3, wherein the actuator includes the piezoelectric material disposed between the driving electrode layer and the ground electrode layer.

5. The haptic feedback actuator of claim 3, wherein the composite layer corresponds to the uppermost layer of the actuator.

6. A haptic feedback device, comprising:
a display panel provided to a haptic device requiring vibrations;
an actuator including a composite layer in which a sensing electrode providing a sensing voltage Va based on a touch pressure of the display panel and a driving electrode providing a driving voltage Vd corresponding to the sensing voltage Va are formed and a piezoelectric material generating vibrations according to the driving voltage Vd by being combined with one surface of the composite layer; and
a vibrating plate disposed between the display panel and the actuator to amplify vibrations generated in the actuator and transfer it to the display panel,
the sensing electrode and the driving electrode formed on the same layer, and
in the composite layer, an area occupied by the sensing electrode being smaller than an area occupied by the driving electrode.

7. The haptic feedback device of claim 6, wherein the actuator includes a ground electrode layer that is a reference of voltage of the driving electrode and the sensing electrode, and
the piezoelectric material is disposed between the composite layer and the ground electrode layer.

8. The haptic feedback device of claim 6, wherein the actuator includes a plurality of driving electrode layers including the driving electrode, and
the ground electrode layer is provided between the plurality of driving electrode layers to apply the driving voltage Vd for generating vibrations.

9. The haptic feedback device of claim 8, wherein the actuator includes a piezoelectric material disposed between the driving electrode layer and the ground electrode layer.

10. The haptic feedback device of claim 8, wherein the composite layer corresponds to the uppermost layer of the actuator.

11. An electronic device, comprising:
a case formed in an inner space;
a display panel disposed to be received in the case;
an actuator including a composite layer in which a sensing electrode providing a sensing voltage Va based on a touch pressure of the display panel and a driving electrode providing a driving voltage Vd corresponding to the sensing voltage Va are formed and a piezoelectric material generating vibrations according to the driving voltage Vd by being combined with one surface of the composite layer; and
a vibrating plate disposed between the display panel and the actuator to amplify vibrations generated in the actuator and transfer it to the display panel,
the sensing electrode and the driving electrode formed on the same layer, and
in the composite layer, an area occupied by the sensing electrode being smaller than an area occupied by the driving electrode.

12. The electronic device of claim 11, wherein the actuator includes a plurality of driving electrode layers including the driving electrode, and
the ground electrode layer is provided between the plurality of driving electrode layers to apply the driving voltage Vd for generating vibrations.

13. The electronic device of claim 12, wherein the composite layer corresponds to the uppermost layer of the actuator.

14. The haptic feedback actuator of claim 1, wherein the sensing electrode and the driving electrode are formed on the same surface.

15. The haptic feedback device of claim 6, wherein the sensing electrode and the driving electrode are formed on the same surface.

16. The electronic device of claim 11, wherein the sensing electrode and the driving electrode are formed on the same surface.

* * * * *